United States Patent [19]

Fleischmann et al.

[11] 4,417,152
[45] Nov. 22, 1983

[54] ELECTRIC SWITCHING DEVICE

[75] Inventors: Heinz Fleischmann, Nuremberg; Helmut Steckmann, Schwanstetten, both of Fed. Rep. of Germany

[73] Assignee: Te Ka De Felten & Guilleaume Fernmeldeanlagen GmbH, Nuremberg, Fed. Rep. of Germany

[21] Appl. No.: 312,853

[22] Filed: Oct. 19, 1981

[30] Foreign Application Priority Data

Oct. 18, 1980 [DE] Fed. Rep. of Germany ....... 3039408

[51] Int. Cl.³ .............................................. H02J 9/00
[52] U.S. Cl. ....................................... 307/64; 307/130
[58] Field of Search .................... 307/86, 87, 130, 64, 307/66; 365/228, 229; 371/65

[56] References Cited

U.S. PATENT DOCUMENTS 3,596,106  7/1971  Raddi ..................................... 307/66
3,757,131  9/1973  Krutz et al. ........................... 307/66
4,247,913  1/1981  Hiniker et al. ....................... 365/228

Primary Examiner—Elliot A. Goldberg
Assistant Examiner—Todd E. DeBoer
Attorney, Agent, or Firm—Michael J. Striker

[57] ABSTRACT

An electronic switching device is described for use with microprocessors and other memory containing devices. The electronic switching device can be adjusted to provide control signals out to the microprocessor or other memory containing devices when the supply voltage common to all units goes above or falls below predetermined values. The control signals substitute an auxiliary voltage for the supply voltage when wide fluctuations occur. Further, the control signals introduce delays which allow the microprocessor or the memory containing devices to complete an internal processing step before switching in the auxiliary voltage.

8 Claims, 5 Drawing Figures

ELECTRIC SWITCHING DEVICE

FIELD OF THE INVENTION

This invention generally relates to an electronic switching device. Specifically this invention relates to an electronic switching device for use with microprocessors and other memory containing devices.

BACKGROUND OF THE INVENTION

When electrical devices are connected to current supplies these supplies may experience large voltage fluctuations or have superposed on the current supply large transient voltages which interfere with the operation of control devices which are connected to the current supply. An example of the foregoing is the situation of a mobile transmitter or receiver employed for radio telephone service while installed in a motor vehicle or ship. These mobile installations are connected to a direct current source such as a battery from which operating current is drawn.

A typical mobile telephone installation in a car may comprise a radio telephone set, an operating device and a talking location. The radio telephone device consists of a transmitter, a receiver, and a combined selective calling and dial system (SRWE). The SRWE system functions in a manner designed to control the making and breaking of the telephone connection as well as to perform control functions which are required for operation of the radio telephone installation. The radio telephone is generally installed in the trunk of a motor vehicle and is connected by a cable with the talking and operating location. The radio telephone installed in the trunk is also connected to the battery of the vehicle by another cable.

The selective calling and dial system function may be performed by a microprocessor which is utilized in the following manner. The code conversion of the coded numbers transmitted over the radio channel are stored in fixed valve memories (ROM). ROM is the acronym for read only memories, which memories store preselected information to be recalled when required. Information which is processed and which changes such as a calling number or the channel group of a party is stored in a random access memory (RAM).

The ROM memory will store its information indefinitely whether power is applied or removed from the memory. The RAM memory, on the other hand, requires that it be refreshed by the microprocessor in order to retain its information. Removal of power from the microprocessor or the RAM will result in a loss of information stored in the memory. Consequently the microprocessor and RAM will be provided with an alternate source of current. This alternate source of current is provided by an internal battery when current from the vehicle battery is turned off.

Further, during switching of the various control functions transient conditions may occur which are superposed on the direct current supply and provide over voltage or under voltage conditions to the microprocessor and RAMs. During these transient conditions the microprocessor may be caused to execute incorrect orders and to write or cancel data stored in the RAMs. Therefore, the radio telephone equipment controlled by the microprocessor will malfunction with the placement of incorrect calls as a possibility.

Prior art has attempted to correct for the transient conditions as well as over or under voltage conditions which may exist at different instances of time, these fluctuations of voltage will interfere with the proper functioning of the radio telephone system as herein before described.

One of the prior art devices which is used to eliminate the over voltage condition is the zener diode. The zener diode is disposed across the direct current supply in series with a current limiting resistor. The regulated current is obtained from the zener diode. The zener diode will clip transient voltages which are in excess of the zener diode value. Therefore voltage transients due to switching processes such as obtained when starting the engine of the motor vehicle will be stabilized. The zener diode will not be able to regulate the supply voltage during the times when the voltage falls below the zener diode level.

When the radio telephone is turned off the removal of voltage from the microprocessor and RAMs may be delayed by the use of large electrolytic capacitors. These large capacitors store the electrical energy and change the stored energy at a slow rate. The capacitors are a prior art device which is used to compensate for under voltage conditions for short periods of time.

Prior art has also employed a switching over to an auxiliary voltage source to power the microprocessor and the RAMs when the radio telephone has been shut off by removal of vehicle battery current. For this purpose a switch may be provided which is manually operated so that when the radio telephone is turned off auxiliary current may be supplied. There is a great probability that the switch may not be operated. Furthermore, the requirement exists that the switch be operated at a proper time after the under or over voltage condition exists.

Much of the aforementioned prior art has appeared in various publications which follow and are incorporated herein by reference. From Elektronik, 1967, Heft 7, Dipl.-ing. Manfred Hanemann "Elektronische Langzeitglieder", electronic time circuits for obtaining long delay times or switch times are known. Thereby, the time defining capacity is charged linear. For realizing a switch on delay circuit, a circuit arrangement is mentioned on page 208, 2.4.2. "Einschaltverzoegerung", wherein a transistor only switches when at the capacity the zener voltage of a zener diode is obtained in the emitter circuit of this transistor. On page 209, 2.4.3. "Abschaltverzoegerung", a circuit arrangement is mentioned wherein a condenser is discharged linear through a transistor and a resistor. Only after the delay time which is adjusted by means of the condenser, the resistor and a diode, the input side potential charge is indicated at the output.

These electronic time circuits have the disadvantage that a relative expensive circuit arrangement has to be used for obtaining short delay times. If, as stated on page 207, a monostable flip-flop is used as a time member, already interference dimensions like current fluctuations or interference pulses at the output of this time member may be triggered. Furthermore, on page 209 a discriminator circuit is mentioned with a zener diode in the base circuit of a transistor. In this circuit arrangement it is disadvantageous that the threshold voltage is exclusively determined by the zener voltage, and that in view of the exemplary fluctuations of the same zener diodes different threshold voltages are generated.

SUMMARY OF THE INVENTION

It is therefore an object of the present invention to provide an electronic switching device which will, during voltage fluctuation of the supply voltage, generate control signals, for use by devices within a device, which will switch the devices on or off so that data or program errors are prevented.

The present invention comprises an electronic switch, which is powered by the supply voltage. The electronic switch is controlled by a threshold valve circuit which sets the operating voltage output from the electronic switch. The output voltage from the regulator is input to a switch on delay circuit. The output of the switch on delay circuit provides a first control signal for use by the devices within a device. The first control signal is then input to a switch off delay circuit which outputs a second control signal for use by at least one of the devices within a device. The switch off delay circuit is connected to at least one auxiliary voltage source.

This invention is based on the fact that by monitoring the momentary amplitude value of the supply voltage source with the electronic switching device of the present invention suitable control signals are generated for use by the microprocessor. The control signals fed to the microprocessor reliably prevents the microprocessor from executing incorrect orders or to write or cancel information in associated random access memories. The circuit arrangement is simple and the components are commercially available structural elements.

BRIEF DESCRIPTION OF THE DRAWINGS

The present invention will be better understood in conjunction with the following drawings together with a description of the preferred embodiment;

FIG. 3, is a set of graphs showing the voltage at various points of FIG. 2 when the supply voltage is switched on;

DESCRIPTION ON THE PREFERRED EMBODIMENT

Figure 1:
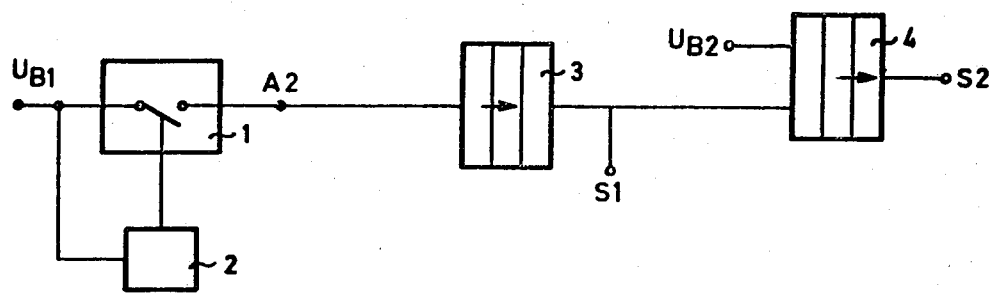
FIG. 1, shows a block diagram of the electronic switching device of the present invention.

FIG. 1 shows the block diagram of the electronic switch device of the present invention. A supply voltage (UB1) is connected to an electronic switch 1. The output of electronic switch 1 is controlled by a threshold valve circuit 2 and is designated as an output A2. Output A2 is fed to a switch on delay circuit 3. The output of switch on delay circuit 3 is fed to a switch off delay circuit 4.

The output of switch on delay circuit 3 also provides a first control signal S1 as can be seen. Switch off delay circuit 4 has an auxiliary voltage UB2 connected to it and also outputs a second control signal S2.

Figure 2:
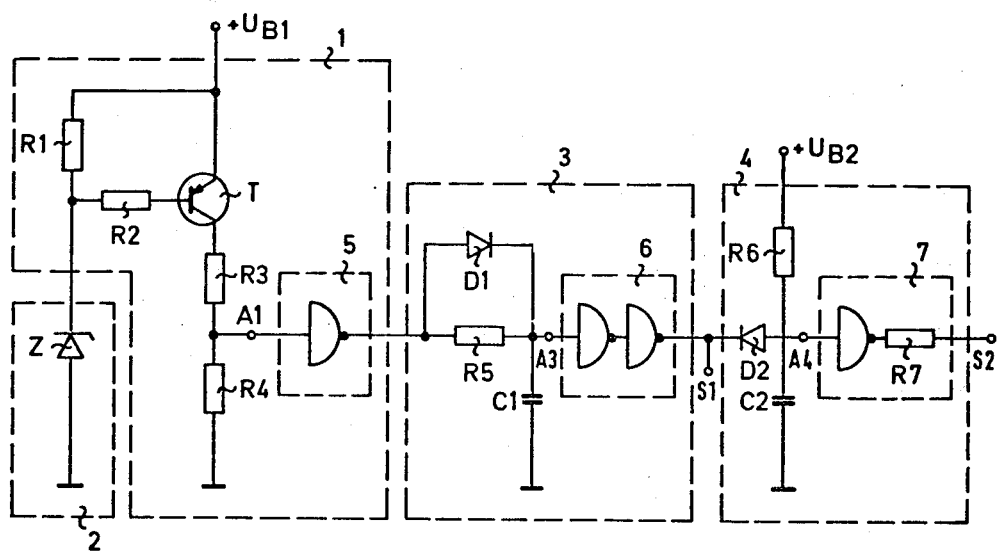
FIG. 2, shows a schematic diagram of the electronic switching device.

FIG. 2 shows the electronic switch device of the present invention in schematic form. The electronic switch 1 is shown to consist of a transistor T having its emitter connected to the supply voltage UB1. The emitter of transistor T is also connected to a resistor R1. The resistor R1 is connected to a resistor R2 which is then connected to the base of transistor T. The junction between resistor R1 and resistor R2 is connected to the threshold value circuit 2. Threshold value circuit 2 contains a zener diode Z having its cathode connected to the junction of the resistors R1 and R2 and its anode connected to ground. Ground is the opposite polarity of the power supply voltage UB1. The collector of transistor T is attached to a resistor R3 which is connected to a resistor R4. The other end of resistor R4 is connected to ground. The junction of resistor R3 and resistor R4 is fed to a pulse shaper 5 which inverts its input. An output A1 is used to illustrate the performance of the electronic switch 1. The output of the electronic switch 1 is gotten from pulse shaper 5 and applied to the switch on delay circuit 3. The wave form between the electronic switch 1 and the switch on delay circuit 3 is seen by looking at the output A2 (shown on FIG. 1).

Figure 3:
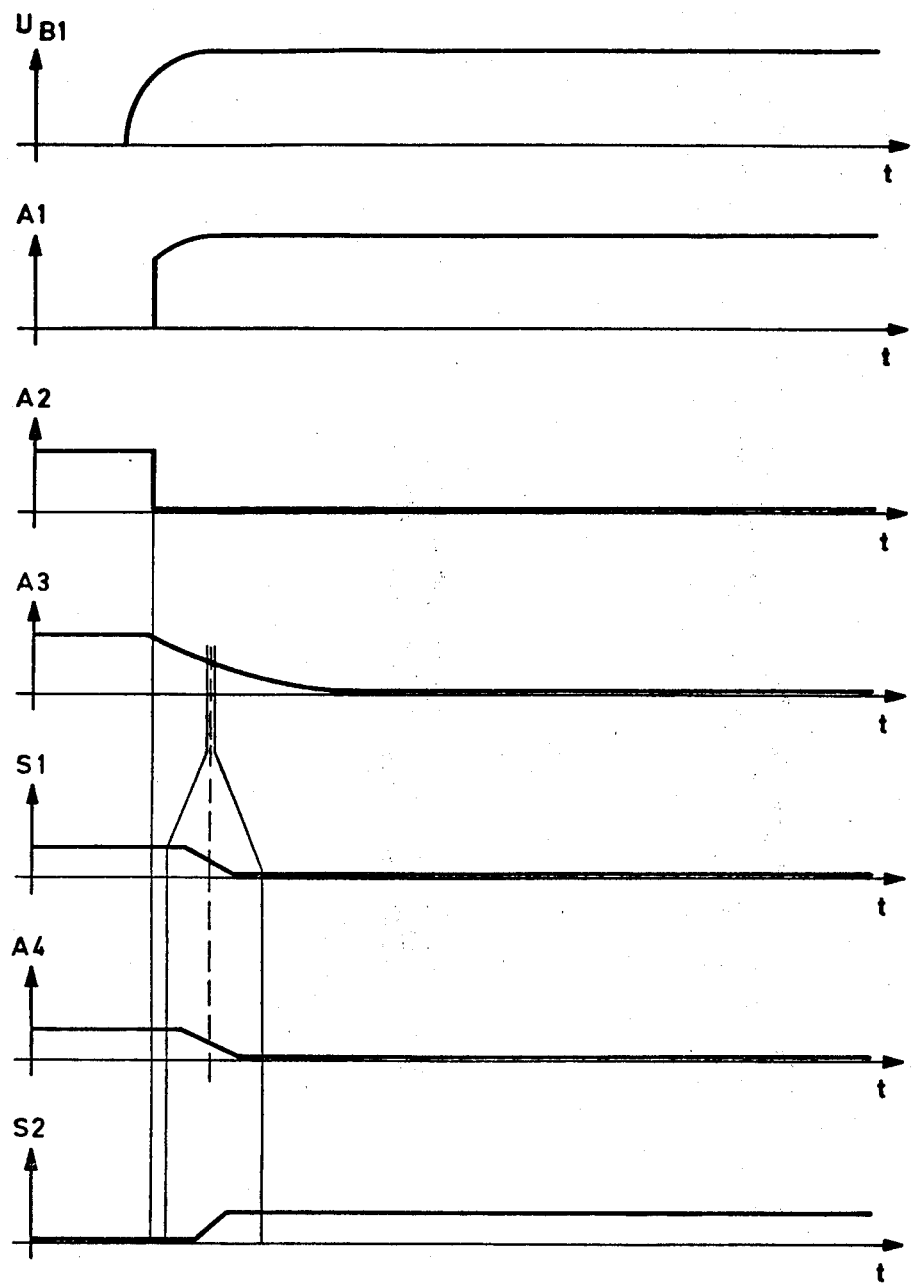
Figure 4:
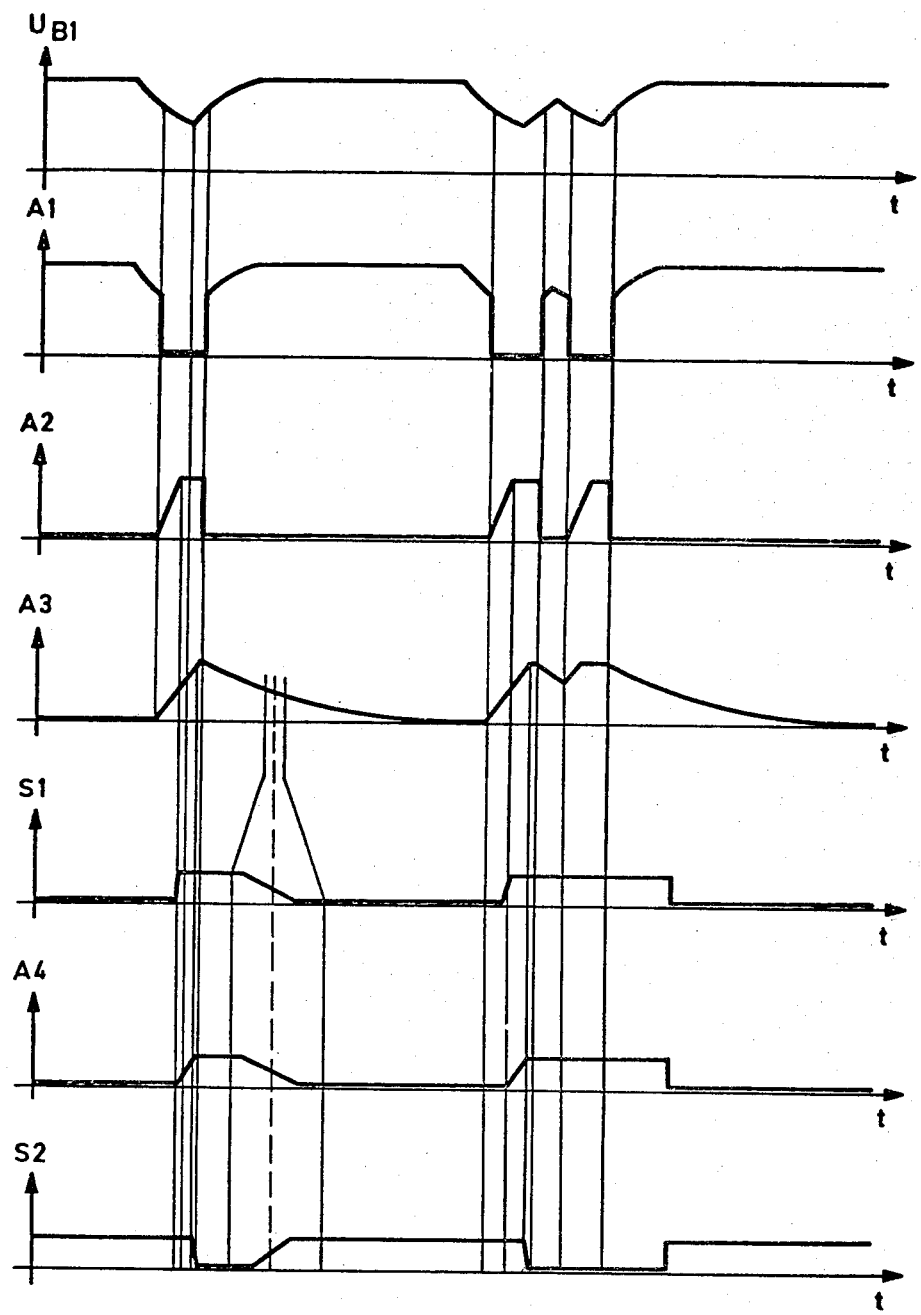
FIG. 4, is a set of graphs showing the voltage at various points of FIG. 2 when the supply voltage fluctuates.
Figure 5:
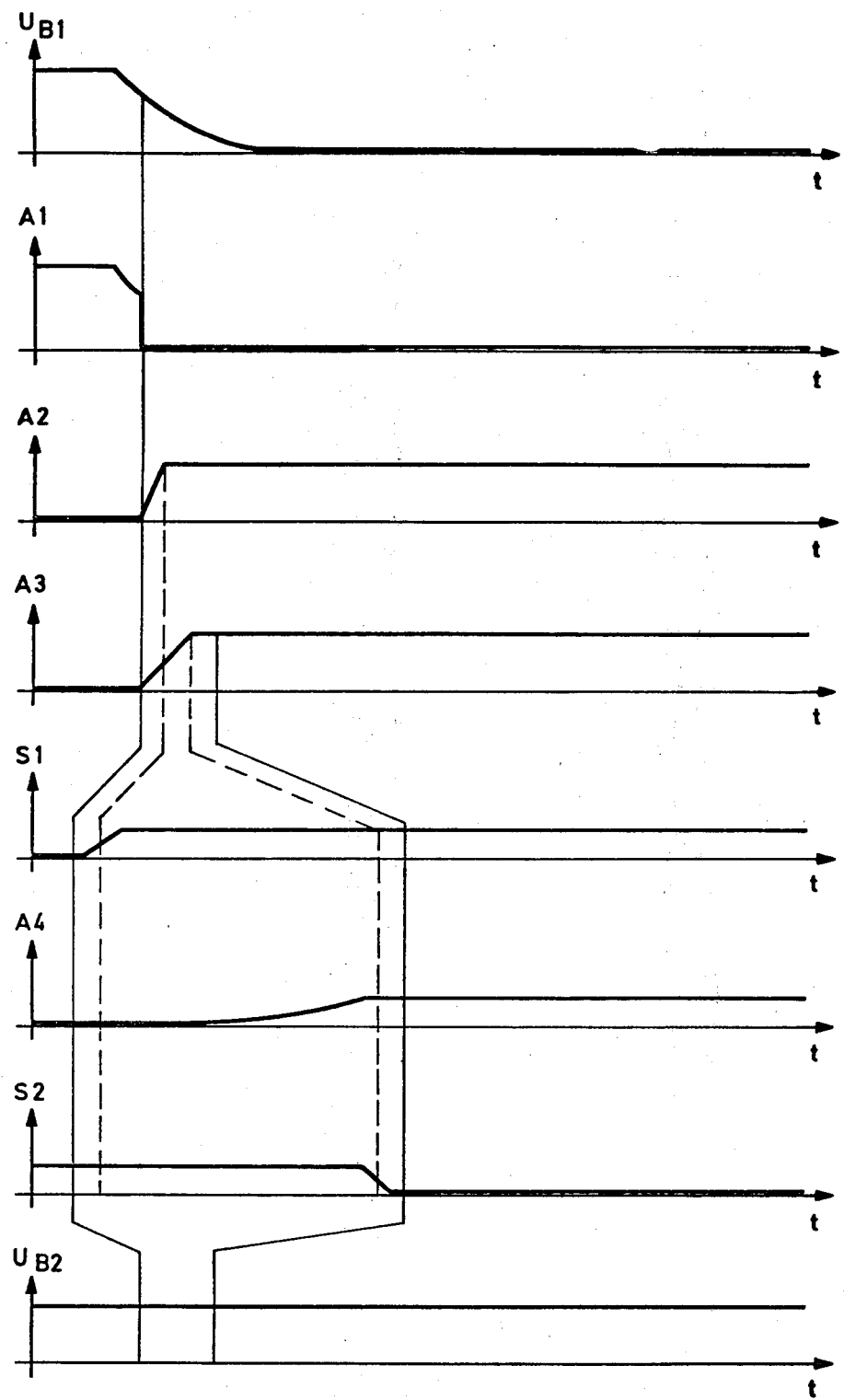
FIG. 5, is a set of graphs showing the voltage at various points of FIG. 2 when the supply voltage is switched off.

Switch on delay circuit 3 consist of the delay timer comprising a diode D1 connected in parallel with a resistor R5. One end of the parallel combination being connected to the anode of diode D1 and the other end connected to the cathode of diode D1. The cathode of diode D1 is connected to a capacitor C1. The other end of capacitor C1 being connected to ground. At the junction of capacitor C1, resistor R5 and diode D1 is found the output A3 which is fed to a pulse shaper 6. The pulse shaper 6 is comprised of two inverters as shown. The output of pulse shaper 6 is also the output of switch on delay circuit 3. The output of switch on delay circuit 3 provides the first control signal S1. The output of switch on delay circuit 3 is fed to the switch off delay circuit 4. Within circuit 4 is a diode D2 having its cathode connected to the output of delay circuit 3. The anode of diode D2 is connected to the junction of a resistor R6 and a capacitor C2. The other end of capacitor C2 is connected to ground and the other end of resistor R6 is connected to a auxiliary voltage UB2. The common junction of capacitor C2, diode D2 and resistor R6 provides an input to a pulse shaper 7. An output A4 is available at the foregoing junction for viewing of a wave form as shown in FIGS. 3, 4, and 5. Pulse shaper 7 provides a second control signal S2 as output of the switch off delay circuit 4. Pulse shaper 7 comprises a resistor R7 and the inverter shown.

FIG. 2 in conjunction with FIGS. 3, 4, and 5 will serve to explain the operation of the preferred embodiment. It will be noted that the points UB1, A1, A2, A3, S1, A4, S2 and UB2 are defined with reference to FIGS. 1 and 2. The aforementioned points are shown on FIGS. 3, 4, and 5 and FIGS. 3, 4, and 5 serve to show the voltage waveforms as a function of time for three conditions.

The condition for FIG. 3 is that supply voltage UB1 has been off and has been just switched on and curve UB1 of FIG. 3 shows the voltage increasing to its final value. The transistor T does not show any output voltage, as can be seen from curve A1, until the threshold valve as defined by the zener diode Z is reached. As the voltage at A1 becomes more positive and at some preselectable point determined by the ratio of resistor R3 and resistor R4 the pulse shaper 5 operates to provide logic low level output as can be seen in A2 of FIG. 3. When the output at A2 was high it charged the delay timer formed by diode D1, resistor R5 and capacitor C1. The delay time of the delay timer circuit can be varied to suit circuitry requirements by varying the time constant of the foregoing combination.

When the voltage at A2 goes to a logic low level the foregoing delay timer circuit discharges to the logic low level shown in A3. At some preselected point as shown by the vertical dotted line on A3 the pulse shaper 6 changes state in an abrupt manner. This abrupt transition of pulse shaper 6 ensures a well defined first control signal S1. The control signal S1 can then be used to cause a device to which it is connected to begin operation after UB1 has reached a preselected level. The voltage wave form at A4 is similar to that at S1 as is seen in FIG. 3. Since pulse shaper 7 contains the inverter the second control signal S2 goes from a logic low to a logic high as A4 goes from a logic high to a logic low. The small area defined in curve A3 has been expanded in curves S1, A4 and S2 to show the sharp transition available at S1 and S2. In summary the characteristic condition change of the control signals S1 and S2 occurs and the microprocessor assumes its normal program sequence.

FIG. 4 shows the various voltage wave forms occurring in the electronic switching device of the present invention as the supply voltage UB1 fluctuates below a threshold valve. The logic of the circuitry operation is generally the same as for FIG. 3. The first control signal S1 changes immediately as the threshold value is passed while the second control signal S2 changes in a delayed manner. The delay of second control signal S2 can be adjusted to meet the connected device requirements by varying resistor R6 and condenser C2 or using a potentiometer for R6. During return to the threshold voltage level by supply voltage UB1 the switch on delay circuit 3 is effective and the sequence of signals corresponds to the ones shown in FIG. 3.

Finally, FIG. 5 shows the sequence of voltage wave forms when the supply voltage UB1 is switched off. As the supply voltage UB1 falls below the threshold value control signal S1 immediately changes its value. The slope of the first control signal S1 as shown in FIG. 5 is the result of the condenser C1 discharging through the diode D1.

In switch off delay circuit 4 the condenser C2 is charged through resistor R6. The voltage at A4 is an exponential function which delays the change of second control voltage S2 allowing the microprocessor to execute its last order. The control signals S1 and S2 are maintained by the auxiliary voltage source UB2 after supply voltage UB1 has been switched off. Since voltage source UB2 powers the control signals S1 and S2 the return of supply voltage UB1 allows for distinct control signals with a clear polarity change which can not be misinterpreted by the microprocessor.

Although the preferred embodiment has been shown for use in mobile radio telephone service other applications are possible. The electronic switching device of the present invention may be used in program controlled radio or cassette devices or in work benches. In all its possible applications a program control will act on a memory device so that changes in power supply voltage outside of predetermined values will cause a switching over to an auxiliary voltage source for memory device operation.

What is claimed is:

1. An electronic switching device for generating control signals for an electrical device which contains a current supply device and devices fed therefrom, comprising:
   an electronic switch controlled by;
   a threshold value circuit which switches;
   a supply voltage controlled by said threshold value circuit to;
   a switch on delay circuit having;
   a first control signal as an output, said first control signal being fed to;
   a switch off delay circuit having as an additional input at least one auxiliary voltage source and as an output a second control signal so that during the switching on, or switching off, or during voltage fluctuations of said supply voltage at least one of said devices is connectable with at least said second control signal, to the auxiliary voltage source.

2. The device described in claim 1 wherein, said threshold value circuit is zener diode.

3. The device described in claim 1 wherein, said electronic switch consists of a transistor having its emitter connected to said supply voltage, said emitter is also connected to a first resistor which resistor is connected to a second resistor which other end is connected to the base of said transistor, the common junction of said resistors being connected to the cathode of a zener diode having its anode connected to ground, the collector of said transistor is connected to a third resistor in series with a fourth resistor which resistor other end is connected to ground, the common junction between said third and fourth resistors providing a point for the pickup of the input signal for first pulse shaper.

4. The device described in claims 1 or 3 wherein, said electronic switch consists of an inverter being used as said first pulse shaper.

5. The device described in claim 1 wherein said switch off delay circuit comprises a second diode having its cathode connected to the output of said switch on delay circuit and its anode connected to the common junction of a sixth resistor and a second capacitor, the other end of said sixth resistor being connected to the positive side of an auxiliary voltage source and the other end of said sixth resistor being connected to ground so that the anode of said diode is connected to a third pulse shaper thereby providing an input for said third pulse shaper.

6. The device described in claim 7 wherein, said switch off delay circuit comprises said third pulse shaper which consists of an inverter connected in series with a seventh resistor.

7. The device described in claim 9 wherein, said switch-on delay circuit comprises said second pulse shaper which second pulse shaper is comprised of a set of two inverters connected in series.

8. An electronic switching device for generating control signals for an electrical device which contains a current supply device and devices fed therefrom, comprising:
   an electronic switch controlled by;
   a threshold value circuit which switches;
   a supply voltage controlled by said threshold value circuit to;
   a switch delay on delay circuit having;
   a first control signal as an output, said first control signal being fed to;
   a switch off delay circuit having as an additional input at least one auxiliary voltage source and as an output a second control signal so that during the switching on, or switching off, or during voltage fluctuations of said supply voltage at least one of said devices is connectable with at least said second control signal, said switch on delay circuit comprising a first diode connected in parallel with a fifth resistor, one end of the parallel combination being connected to first pulse shaper and the other end being connected to one end of a first capacitor having its other end connected to ground, the common junction of said resistor and said capacitor having the cathode of said first diode connected thereto whereby the output signal of said first pulse shaper is fed to the anode of said first diode and the input signal for a second pulse shaper part of said switch on delay circuit is connected to the cathode of said first diode.

* * * * *